(12) United States Patent
Heo et al.

(10) Patent No.: US 11,165,439 B2
(45) Date of Patent: Nov. 2, 2021

(54) SYNDROME-BASED DECODING METHOD AND APPARATUS FOR BLOCK TURBO CODE

(71) Applicant: KOREA UNIVERSITY RESEARCH AND BUSINESS FOUNDATION, Seoul (KR)

(72) Inventors: Jun Heo, Seoul (KR); Byungkyu Ahn, Seoul (KR); Sung Sik Yoon, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 96 days.

(21) Appl. No.: 16/655,528

(22) Filed: Oct. 17, 2019

(65) Prior Publication Data

US 2020/0136649 A1 Apr. 30, 2020

(30) Foreign Application Priority Data

Oct. 26, 2018 (KR) ........................ 10-2018-0128883

(51) Int. Cl.
| | |
|---|---|
| H03M 13/11 | (2006.01) |
| H03M 13/15 | (2006.01) |
| H03M 13/25 | (2006.01) |
| H03M 13/29 | (2006.01) |

(52) U.S. Cl.
CPC .... *H03M 13/1174* (2013.01); *H03M 13/1108* (2013.01); *H03M 13/1575* (2013.01); *H03M 13/258* (2013.01); *H03M 13/2948* (2013.01)

(58) Field of Classification Search
CPC ......... H03M 13/1174; H03M 13/1108; H03M 13/1575; H03M 13/258; H03M 13/2948; H03M 13/618; H03M 13/19; H03M 13/3707; H03M 13/6502; H03M 13/2963; H03M 13/2975
USPC ...................................................... 714/752
See application file for complete search history.

(56) References Cited

U.S. PATENT DOCUMENTS

| | | | | | |
|---|---|---|---|---|---|
| 6,009,552 | A | * | 12/1999 | Ariel ...................... | H03M 13/23 714/780 |
| 6,101,614 | A | * | 8/2000 | Gonzales .............. | G06F 11/106 714/6.1 |
| 6,182,264 | B1 | * | 1/2001 | Ott ........................ | H03M 13/09 714/774 |
| 10,691,540 | B2 | * | 6/2020 | Kumar .............. | H03M 13/2906 |

(Continued)

*Primary Examiner* — James C Kerveros
(74) *Attorney, Agent, or Firm* — NSIP Law

(57) ABSTRACT

A syndrome-based decoding method and apparatus for a block turbo code are disclosed. An embodiment of the present invention provides a syndrome-based decoding method for a block turbo code that includes an extended Hamming code as a component code, where the decoding method includes: (a) generating an input information value for a next half iteration by using channel passage information and the extrinsic information and reliability factor of a previous half iteration; (b) generating a hard decision word by way of a hard decision of the input information value; (c) calculating an n number of 1-bit syndromes, which corresponds to the number of columns or rows of the block turbo code, by using the hard decision word; and (d) determining whether or not to proceed with the next half iteration by using the calculated n number of 1-bit syndromes.

4 Claims, 15 Drawing Sheets

(56) References Cited

U.S. PATENT DOCUMENTS

2019/0068219 A1\* 2/2019 Bhatia .................... G11C 29/42
2020/0083911 A1\* 3/2020 Heo ................... H03M 13/1108

\* cited by examiner

FIG. 10A

[1].(32,26,4) TURBO CODE

| SNR | 1 | 2 | 3 | 4 | 5 | 6 | 7 | 8 |
|---|---|---|---|---|---|---|---|---|
| 1 | 170% | 182% | 155% | 158% | 153% | 157% | 166% | 185% |
| 1.25 | 166% | 172% | 152% | 151% | 144% | 145% | 155% | 169% |
| 1.5 | 163% | 167% | 143% | 146% | 137% | 138% | 142% | 156% |
| 1.75 | 158% | 158% | 142% | 133% | 129% | 128% | 138% | 151% |
| 2 | 152% | 153% | 134% | 129% | 122% | 124% | 134% | 155% |
| 2.25 | 147% | 144% | 126% | 122% | 117% | 133% | 169% | 229% |
| 2.5 | 143% | 136% | 119% | 116% | 117% | 150% | 238% | 378% |
| 2.75 | 140% | 133% | 116% | 112% | 115% | 182% | 312% | 513% |
| 3 | 137% | 129% | 112% | 107% | 119% | 217% | 395% | 624% |
| 3.25 | 134% | 127% | 109% | 102% | 121% | 227% | 374% | 633% |
| 3.5 | 130% | 125% | 107% | 95% | 121% | 219% | 303% | 541% |
| avg | 145% | 152% | 143% | 148% | 158% | 201% | 269% | 378% |

FIG. 10B

[2].(64,57,4) TURBO CODE

| SNR | 1 | 2 | 3 | 4 | 5 | 6 | 7 | 8 |
|---|---|---|---|---|---|---|---|---|
| 1 | 196% | 224% | 155% | 176% | 163% | 177% | 200% | 247% |
| 1.25 | 187% | 224% | 157% | 176% | 163% | 175% | 196% | 246% |
| 1.5 | 183% | 243% | 153% | 174% | 159% | 174% | 194% | 235% |
| 1.75 | 178% | 229% | 155% | 167% | 157% | 168% | 189% | 226% |
| 2 | 170% | 217% | 156% | 166% | 152% | 160% | 177% | 208% |
| 2.25 | 166% | 202% | 153% | 158% | 145% | 150% | 161% | 182% |
| 2.5 | 160% | 190% | 149% | 151% | 135% | 134% | 137% | 147% |
| 2.75 | 156% | 178% | 140% | 137% | 124% | 118% | 120% | 124% |
| 3 | 150% | 162% | 131% | 125% | 114% | 109% | 129% | 177% |
| 3.25 | 145% | 152% | 124% | 115% | 105% | 129% | 257% | 557% |
| 3.5 | 140% | 143% | 117% | 106% | 102% | 196% | 580% | 1928% |
| 3.6 | 139% | 141% | 115% | 101% | 102% | 230% | 739% | 2443% |
| avg | 164% | 195% | 142% | 146% | 135% | 160% | 257% | 569% |

FIG. 10C

[3].(128,120,4) TURBO CODE

| SNR | 1 | 2 | 3 | 4 | 5 | 6 | 7 | 8 |
|---|---|---|---|---|---|---|---|---|
| 1 | 200% | 372% | 160% | 184% | 165% | 184% | 219% | 297% |
| 1.25 | 199% | 362% | 159% | 184% | 163% | 183% | 220% | 302% |
| 1.5 | 210% | 355% | 157% | 188% | 165% | 185% | 217% | 308% |
| 1.75 | 200% | 354% | 157% | 187% | 166% | 185% | 221% | 310% |
| 2 | 198% | 345% | 158% | 188% | 165% | 185% | 219% | 307% |
| 2.25 | 186% | 336% | 156% | 187% | 163% | 184% | 216% | 302% |
| 2.5 | 183% | 317% | 156% | 186% | 163% | 180% | 214% | 302% |
| 2.75 | 180% | 291% | 154% | 181% | 158% | 178% | 202% | 275% |
| 3 | 171% | 266% | 153% | 172% | 153% | 163% | 186% | 239% |
| 3.25 | 161% | 237% | 152% | 161% | 143% | 149% | 159% | 189% |
| 3.5 | 155% | 214% | 146% | 148% | 127% | 126% | 128% | 132% |
| 3.75 | 151% | 190% | 137% | 133% | 112% | 101% | 96% | 99% |
| 4 | 145% | 169% | 127% | 116% | 98% | 97% | 186% | 595% |
| 4.1 | 143% | 163% | 124% | 110% | 92% | 120% | 383% | 2239% |
| avg | 177% | 284% | 150% | 166% | 145% | 159% | 205% | 421% |

FIG. 10D

[2].(256,247,4) TURBO CODE

| SNR | 1 | 2 | 3 | 4 | 5 | 6 | 7 | 8 |
|---|---|---|---|---|---|---|---|---|
| 1 | 201% | 529% | 161% | 195% | 174% | 215% | 245% | 345% |
| 1.25 | 166% | 629% | 152% | 178% | 163% | 167% | 218% | 291% |
| 1.5 | 223% | 545% | 161% | 181% | 157% | 174% | 209% | 313% |
| 1.75 | 140% | 447% | 183% | 185% | 172% | 177% | 227% | 345% |
| 2 | 224% | 516% | 160% | 168% | 176% | 206% | 224% | 329% |
| 2.25 | 187% | 688% | 150% | 176% | 170% | 183% | 234% | 352% |
| 2.5 | 195% | 516% | 150% | 191% | 177% | 194% | 244% | 443% |
| 2.75 | 131% | 476% | 158% | 184% | 163% | 193% | 243% | 339% |
| 3 | 202% | 511% | 169% | 189% | 177% | 198% | 267% | 486% |
| 3.25 | 208% | 380% | 151% | 171% | 159% | 173% | 221% | 380% |
| 3.5 | 176% | 490% | 146% | 179% | 162% | 186% | 241% | 425% |
| 3.75 | 173% | 535% | 152% | 169% | 154% | 171% | 213% | 307% |
| 4 | 165% | 281% | 136% | 177% | 149% | 170% | 210% | 268% |
| 4.25 | 178% | 224% | 129% | 155% | 137% | 140% | 134% | 162% |
| 4.5 | 151% | 174% | 135% | 128% | 113% | 105% | 97% | 103% |
| 4.6 | 147% | 204% | 130% | 129% | 104% | 89% | 76% | 84% |
| 4.7 | 146% | 187% | 130% | 121% | 95% | 73% | 94% | 276% |
| 4.75 | 145% | 182% | 129% | 117% | 90% | 72% | 155% | 858% |
| avg | 176% | 420% | 149% | 166% | 149% | 160% | 197% | 339% |

FIG. 11A

[1].(32,26,4) TURBO CODE

| SNR | 1 | 2 | 3 | 4 | 5 | 6 | 7 | 8 |
|---|---|---|---|---|---|---|---|---|
| 1 | 0.79% | 0.75% | 1.03% | 1.05% | 1.23% | 1.50% | 1.87% | 1.87% |
| 1.25 | 0.83% | 1.03% | 1.14% | 1.17% | 1.69% | 1.74% | 1.70% | 2.03% |
| 1.5 | 0.87% | 1.15% | 1.34% | 1.73% | 1.61% | 1.94% | 1.85% | 2.62% |
| 1.75 | 1.19% | 1.15% | 1.39% | 1.85% | 1.63% | 1.97% | 2.35% | 1.95% |
| 2 | 1.14% | 1.34% | 1.88% | 2.33% | 2.32% | 2.67% | 2.79% | 2.11% |
| 2.25 | 1.26% | 1.53% | 2.10% | 2.58% | 2.70% | 3.00% | 2.91% | 3.72% |
| 2.5 | 1.43% | 1.74% | 2.17% | 2.66% | 3.02% | 3.01% | 2.90% | 1.66% |
| 2.75 | 1.54% | 2.02% | 2.61% | 3.18% | 3.73% | 3.27% | 4.01% | 1.95% |
| 3 | 1.72% | %.32 | 2.97% | 3.54% | 3.88% | 3.47% | 3.80% | 4.00% |
| 3.25 | 1.91% | 2.65% | 3.33% | 4.00% | 4.05% | 3.32% | 3.24% | 3.42% |
| 3.5 | 2.11% | 2.92% | 3.71% | 4.28% | 4.16% | 3.78% | 3.41% | 5.10% |
| avg | 1.34% | 1.69% | 2.15% | 2.58% | 2.73% | 2.70% | 2.80% | 2.77% |

FIG. 11B

[2].(64,57,4) TURBO CODE

| SNR | 1 | 2 | 3 | 4 | 5 | 6 | 7 | 8 |
|---|---|---|---|---|---|---|---|---|
| 1 | 0.15% | 0.15% | 0.25% | 0.41% | 0.47% | 177% | 0.62% | 0.83% |
| 1.25 | 0.14% | 0.17% | 0.31% | 0.37% | 0.53% | 175% | 0.62% | 0.81% |
| 1.5 | 0.18% | 0.14% | 0.30% | 0.35% | 0.47% | 174% | 0.63% | 0.77% |
| 1.75 | 0.21% | 0.18% | 0.34% | 0.44% | 0.53% | 168% | 0.59% | 0.88% |
| 2 | 0.21% | 0.22% | 0.30% | 0.39% | 0.48% | 160% | 0.68% | 0.78% |
| 2.25 | 0.37% | 0.27% | 0.35% | 0.51% | 0.68% | 150% | 0.71% | 0.87% |
| 2.5 | 0.33% | 0.35% | 0.52% | 0.51% | 0.69% | 134% | 0.76% | 1.05% |
| 2.75 | 0.44% | 0.47% | 0.63% | 0.86% | 0.97% | 118% | 0.87% | 1.05% |
| 3 | 0.39% | 0.60% | 0.79% | 1.03% | 0.74% | 109% | 0.89% | 0.70% |
| 3.25 | 0.60% | 0.76% | 1.04% | 1.29% | 1.33% | 129% | 0.98% | 2.08% |
| 3.5 | 0.66% | 0.92% | 1.28% | 1.53% | 1.65% | 196% | 1.58% | 1.03% |
| 3.6 | 0.71% | 1.00% | 1.37% | 1.65% | 1.71% | 230% | 1.59% | 1.25% |
| avg | 0.36% | 0.44% | 0.62% | 0.78% | 0.85% | 160% | 0.87% | 1.01% |

FIG. 11C

[3].(128,120,4) TURBO CODE

| SNR | 1 | 2 | 3 | 4 | 5 | 6 | 7 | 8 |
|---|---|---|---|---|---|---|---|---|
| 1 | 0.04% | 0.03% | 0.15% | 0.18% | 0.19% | 0.34% | 0.35% | 0.36% |
| 1.25 | 0.03% | 0.03% | 0.16% | 0.17% | 0.25% | 0.29% | 0.35% | 0.46% |
| 1.5 | 0.03% | 0.03% | 0.14% | 0.19% | 0.21% | 0.25% | 0.32% | 0.36% |
| 1.75 | 0.03% | 0.03% | 0.18% | 0.18% | 0.24% | 0.28% | 0.33% | 0.37% |
| 2 | 0.03% | 0.04% | 0.16% | 0.19% | 0.23% | 0.29% | 0.32% | 0.32% |
| 2.25 | 0.05% | 0.04% | 0.13% | 0.18% | 0.20% | 0.28% | 0.33% | 0.42% |
| 2.5 | 0.05% | 0.05% | 0.19% | 0.18% | 0.26% | 0.31% | 0.32% | 0.41% |
| 2.75 | 0.05% | 0.05% | 0.16% | 0.15% | 0.20% | 0.32% | 0.34% | 0.41% |
| 3 | 0.08% | 0.07% | 0.14% | 0.16% | 0.23% | 0.27% | 0.41% | 0.40% |
| 3.25 | 0.10% | 0.08% | 0.17% | 0.21% | 0.22% | 0.34% | 0.44% | 0.48% |
| 3.5 | 0.15% | 0.13% | 0.23% | 0.25% | 0.38% | 0.33% | 0.41% | 0.54% |
| 3.75 | 0.15% | 0.24% | 0.36% | 0.41% | 0.43% | 0.39% | 0.51% | 0.70% |
| 4 | 0.22% | 0.29% | 0.45% | 0.57% | 0.62% | 0.65% | 0.88% | 0.84% |
| 4.1 | 0.26% | 0.35% | 0.52% | 0.61% | 0.62% | 0.69% | 0.71% | 0.16% |
| avg | 0.09% | 0.10% | 0.22% | 0.26% | 0.31% | 0.36% | 0.43% | 0.44% |

FIG. 11D

[2].(256,247,4) TURBO CODE

| SNR | 1 | 2 | 3 | 4 | 5 | 6 | 7 | 8 |
|---|---|---|---|---|---|---|---|---|
| 1 | 0.00% | 0.01% | 0.16% | 0.10% | 0.09% | 0.17% | 0.14% | 0.19% |
| 1.25 | 0.00% | 0.00% | 0.09% | 0.04% | 0.15% | 0.13% | 0.16% | 0.16% |
| 1.5 | 0.00% | 0.02% | 0.13% | 0.05% | 0.18% | 0.13% | 0.15% | 0.15% |
| 1.75 | 0.02% | 0.02% | 0.12% | 0.07% | 0.06% | 0.19% | 0.17% | 0.26% |
| 2 | 0.01% | 0.02% | 0.12% | 0.09% | 0.09% | 0.14% | 0.22% | 0.17% |
| 2.25 | 0.02% | 0.00% | 0.17% | 0.13% | 0.13% | 0.14% | 0.13% | 0.19% |
| 2.5 | 0.01% | 0.01% | 0.10% | 0.07% | 0.10% | 0.12% | 0.20% | 0.23% |
| 2.75 | 0.01% | 0.02% | 0.12% | 0.07% | 0.10% | 0.14% | 0.18% | 0.18% |
| 3 | 0.01% | 0.02% | 0.13% | 0.09% | 0.13% | 0.22% | 0.18% | 0.21% |
| 3.25 | 0.00% | 0.00% | 0.16% | 0.11% | 0.10% | 0.09% | 0.09% | 0.22% |
| 3.5 | 0.01% | 0.02% | 0.10% | 0.05% | 0.07% | 0.14% | 0.13% | 0.21% |
| 3.75 | 0.00% | 0.02% | 0.07% | 0.07% | 0.10% | 0.16% | 0.19% | 0.19% |
| 4 | 0.07% | 0.02% | 0.13% | 0.05% | 0.11% | 0.15% | 0.13% | 0.26% |
| 4.25 | 0.03% | 0.08% | 0.09% | 0.10% | 0.19% | 0.10% | 0.18% | 0.25% |
| 4.5 | 0.01% | 0.09% | 0.10% | 0.17% | 0.11% | 0.08% | 0.19% | 0.16% |
| 4.6 | 0.05% | 0.11% | 0.14% | 0.22% | 0.20% | 0.13% | 0.13% | 0.39% |
| 4.7 | 0.10% | 0.13% | 0.21% | 0.20% | 0.21% | 0.20% | 0.17% | 1.01% |
| 4.75 | 0.10% | 0.14% | 0.21% | 0.24% | 0.22% | 0.24% | 0.22% | 0.33% |
| avg | 0.03% | 0.05% | 0.13% | 0.12% | 0.13% | 0.15% | 0.17% | 0.29% |

SYNDROME-BASED DECODING METHOD AND APPARATUS FOR BLOCK TURBO CODE

CROSS-REFERENCE TO RELATED APPLICATIONS

This application claims the benefit of Korean Patent Application No. 10-2018-0128883, filed with the Korean Intellectual Property Office on Oct. 26, 2018, the disclosure of which is incorporated herein by reference in its entirety.

BACKGROUND

1. Technical Field

The present invention relates to a syndrome-based decoding method and apparatus for a block turbo code, more particularly to a syndrome-based block turbo code decoding method and apparatus that employ a low-complexity early stopping technique and a hybrid decoding technique.

2. Description of the Related Art

The block turbo code, proposed by Berrou et al., performs iterative decoding with parallel concatenated convolutional codes having two connected recursive systematic convolutional codes to exhibit performance approaching Shannon's limit.

Iterative decoding is one of the most important features of the block turbo code, and iterative decoding is performed as soft-output generated by each decoder is fed to another decoder.

As the iterative decoding continues, the bit error rate (BER) performance may be improved, but the degree of improvement in BER performance may gradually decrease and reach saturation, whereas decoding computations and decoding delay may increase linearly.

Since the required number of iterations for proper decoding may vary for each frame according to channel properties, fixing the number of decoding iterations may be inefficient. Thus, in order to reduce unnecessary computations and decoding delay, an efficient way of applying early stopping to the iterative decoding of block turbo codes is needed.

The conventional early stopping technique may entail performing decoding for a half of the columns and rows of the input information every time, performing syndrome computation for the results from the columns and rows, and determining that there are no errors if the syndrome for all of the columns and rows is 0 (a zero vector).

This, however, entails the problem of an increased amount of computation, as the procedure of computing the syndrome is performed at each decoding iteration.

Also, there have been proposed various methods aimed at lowering complexity for decoding block turbo codes.

R, Pyndiah, "Near-optimum decoding of product codes: block turbo codes," IEEE Trans. Commun., vol 46, No. 8, pp. 1003-1010, August 1998 (Prior Art 1) presents the Chase-Pyndiah decoding algorithm, which is a method of extending a hard-input hard-output decoding algorithm to soft-input soft-output.

The previous technique differentiates hard-input and soft-input based decoding techniques in the case of a single error, so as to increase the applied rates of hard-input decoding, but does not greatly lower complexity.

Pen-Yao Lu, Erl-Huei Lu, Tso-Cho Chen, "An Efficient Hybrid decoder for Block Turbo Codes," IEEE Commun. Letters, vol. 18, no. 12, pp. 2077-2080, October 2014 (Prior Art 2) presents a method of lowering decoding complexity by using soft-input soft-output decoding and hard-input hard-output decoding selectively according to the number of errors included in the input value of a decoder.

E. H. Lu and P. Y. Lu, "A syndrome-based hybrid decoder for turbo product codes," in Proc. IEEE 3CA Tainan, Taiwan, May 2010, pp. 280-282 (Prior Art 3) presents an algorithm that can greatly lower complexity by calculating the syndrome for a decoder input vector and applying hard-input soft-output decoding for a value of 0, meaning error free, and applying soft-input soft-output decoding for any other syndrome value.

Guo Tai Chen, Lei Cao, Lun Yu, Chang Wen Chen, "An Efficient Stopping Criterion for Turbo Product Codes," IEEE Commun. Letters, vol. 11, no. 6, pp. 525-527, July 2007 (Prior Art 4) presents a method for preventing unnecessary decoding iterations in a procedure for iteratively decoding block turbo codes. The presented method involves performing a syndrome computation on all decoded output vectors after the completion of the decoding procedure for each iteration and finishing the decoding process if all of the output vectors are 0 for all columns and rows, as this ensures that there are no more errors.

Byungkyu Ahn, Sungsik Yoon, Jun Heo, "Low Complexity Syndrome-Based Decoding Algorithm Applied to Block Turbo Codes," IEEE Access., vol. 6, pp. 2169-3536, April 2018 (Prior Art 5) proposes a syndrome-based hybrid decoding technique that can reduce the complexity for decoding block turbo codes. The proposed method applies hard-input soft-output decoding, which has low complexity, as much as possible up to the error correction capability for linear block codes used as the component codes of block turbo codes and applies soft-input soft-output decoding, which has high complexity, only at portions where hard-input soft-output decoding cannot be applied.

SUMMARY OF THE INVENTION

To resolve the problems of the related art described above, an aspect of the invention aims to provide a syndrome-based decoding method and apparatus for block turbo codes that employ a low-complexity early stopping technique and hybrid decoding technique to reduce computation and complexity without performance loss.

To achieve the objective above, an embodiment of the present invention provides a syndrome-based decoding method for a block turbo code that includes an extended Hamming code as a component code, where the decoding method includes: (a) generating an input information value for a next half iteration by using channel passage information and the extrinsic information and reliability factor of a previous half iteration; (b) generating a hard decision word by way of a hard decision of the input information value; (c) calculating an n number of 1-bit syndromes, which corresponds to the number of columns or rows of the block turbo code, by using the hard decision word; and (d) determining whether or not to proceed with the next half iteration by using the calculated n number of 1-bit syndromes.

The hard decision word can be a 1 by n matrix, and the 1-bit syndromes can be calculated by multiplying the hard decision word with an n by 1 matrix having all values of 1.

Step (d) can include calculating syndromes of n−k−1 bits for rows or columns of the block turbo code by multiplying the input information value with a parity check matrix if the n number of 1-bit syndromes are all 0; and determining whether or not the calculated (n−k−1)-bit syndromes are all 0, where the next half iteration can be performed if any one of the (n−k−1)-bit syndromes is not 0.

Step (c) to step (d) can be performed sequentially for all of the rows or columns.

The decoding method can further include: (e) determining whether or not to apply hard-input soft-output based decoding, where, if the n number of 1-bit syndromes calculated in step (c) are all 1, then step (e) can determine whether or not to apply hard-input soft-output based decoding in the next half iteration according to whether or not there are two errors in the previous half iteration.

Step (e) can include: identifying the positions of three bits of the lowest reliability and a bit corrected by the hard-input soft-output based decoding, if there are two errors included in the previous half iteration, and comparing the sum of the reliability values of the three bits of lowest reliability with the reliability value of the bit corrected by the hard-input soft-output based decoding to decide whether or not to perform the hard-input soft-output based decoding.

Step (e) can include: deciding whether or not to perform a hard-input soft-output based decoding by checking whether or not the reliability values of two bits having the lowest reliability and of the bits corrected by the hard-input soft-output based decoding match each other, if the result of calculating the syndromes for the input information value includes two errors.

Another aspect of the present invention provides a syndrome-based decoding apparatus for a block turbo code that includes an extended Hamming code as a component code, where the decoding apparatus includes a processor and a memory connected to the processor, and where the memory stores program instructions executable by the processor to: generate an input information value for a next half iteration by using channel passage information and the extrinsic information and reliability factor of a previous half iteration; generate a hard decision word by way of a hard decision of the input information value; calculate an n number of 1-bit syndromes corresponding to the number of columns or rows of the block turbo code by using the hard decision word; and determine whether or not to proceed with the next half iteration by using the calculated n number of 1-bit syndromes.

An embodiment of the invention provides the advantages of enabling a quick determination of whether or not to perform a next half iteration with a low complexity and increasing decoding efficiency by increasing the applied rates of hard-input soft-output based decoding.

Additional aspects and advantages of the present invention will be set forth in part in the description which follows, and in part will be obvious from the description, or may be learned by practice of the invention.

BRIEF DESCRIPTION OF THE DRAWINGS

FIG. 10A to 10D compare the change in applied rates of the low-complexity hard-input soft-output based decoding from among cases decided to be single errors.

FIG. 11A to 11D illustrate the results of measuring the applied rates of the low-complexity hard-input soft-output based decoding from among cases decided as having two errors.

DETAILED DESCRIPTION OF THE INVENTION

Figure 1:
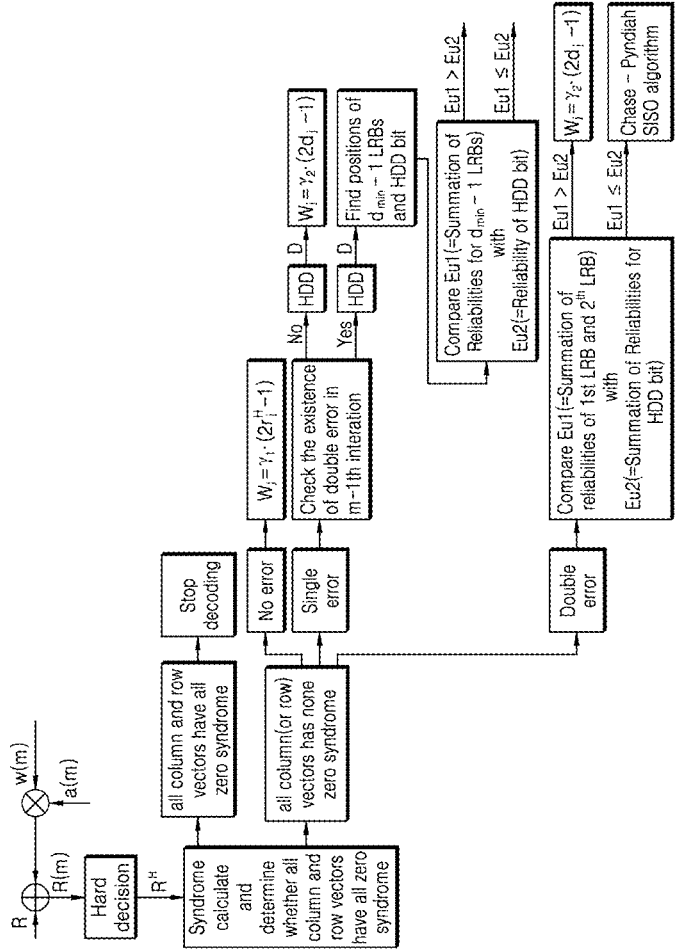
FIG. 1 illustrates a process of syndrome based decoding a block turbo code according to an embodiment of the invention.

As the invention allows for various changes and numerous embodiments, particular embodiments will be illustrated in the drawings and described in detail in the written description.

However, this is not intended to limit the present invention to particular modes of practice, and it is to be appreciated that all changes, equivalents, and substitutes that do not depart from the spirit and technical scope of the present invention are encompassed in the present invention.

The present invention applies the following techniques to lower the complexity of decoding a block turbo code without performance loss.

1) Low-Complexity Early Stopping Technique

The conventional early stopping technique used for decoding block turbo codes may involve completing decoding iterations for a half of all columns (or rows) and then calculating to see whether or not the syndromes obtained by multiplying all column (or row) vectors with a parity check matrix are all 0.

If the syndromes for all columns and rows are 0, the decoding iterations are stopped, but performing syndrome decisions at every decoding iteration in this manner increases the amount of computation.

To resolve this, an embodiment of the present invention utilizes the property that, if among the syndromes of the extended Hamming code in a block turbo code the value of a particular bit is known, then it is possible to differentiate those having single errors and those having other errors.

An embodiment of the invention can greatly reduce the amount of computation expended in error estimation by preliminarily using only one bit to decide whether or not errors are present and performing the next half iteration if it is decided that at least one from among all of the columns and rows has a single error.

2) Increased Application Rate of Hard-Input Soft-Output Based Decoding in Cases Decided as Having Single Errors In a block turbo code having an extended Hamming code as a component code, it is possible to divide the input information values, according to the forms of error, into those having no errors, those having single errors, and those having other types of errors, by way of computing the syndromes of the input information values during a syndrome-based decoding procedure.

In a previous study, it was shown that low-complexity decoding is possible without performance loss even if hard-input decoding, which has low complexity, is applied instead of the more complex soft-input based decoding, in certain cases of having single error occurrences and cases of having no errors.

In the Chase-Pyndiah decoding technique, which is used as a soft-input based decoding technique in the related art, a procedure for finding a codeword with a ML decoding method is performed. It is proven that, in cases where the sum of reliability values of the three bits having the lowest reliability is smaller than the reliability value of the bit position corrected by the hard-input soft-output based decoding for cases decided as having single errors as presented by an embodiment of the present invention, the codeword and the bit position corrected by the hard-input soft-output based decoding are the same. This can be utilized to increase the rate of applying hard-input soft-output based decoding, which is of a lower complexity, for cases that are decided as having single errors, and this in turn can greatly lower decoding complexity.

3) Increased Application Rate of Hard-Input Soft-Output Based Decoding in Cases Decided as Having Multiple Errors For a block turbo code having an extended Hamming code as a component code, from among the cases where it is decided from the syndrome computation of the input information values that there are two errors, if there is an error in the parity bit added during the extension of the extended Hamming code and an error in one of the remaining bits, the two bit errors may be corrected.

When it is decided that the input information value has two errors, an error correction of 2 bits may occur. To correct such error patterns with hard-input soft-output based decoding, it is proven in relation to an embodiment of the present invention that, when the sum of the reliability values of the 2 bits is smaller than the sum of the reliability values of the bit having the lowest reliability and the bit having the second lowest reliability, a codeword such as the ML codeword of a conventional soft-input based decoding technique can be obtained through a decoding method based on hard-input information. Thus, the decoding complexity can be lowered by as much as the applied rate of the above.

A detailed description of a method of decoding a block turbo code is provided below, with reference to the accompanying drawings.

FIG. 1 illustrates a process of decoding a block turbo code according to an embodiment of the invention.

Referring to FIG. 1, the input information value R(m) for a next half iteration may be generated from a sum of the information R that has passed through the channel and a product of the extrinsic information W and the reliability factor a(m) of the next half iteration.

Through a hard decision of the input information value R(m), a hard decision word $R^H$ may be generated.

Figure 2:
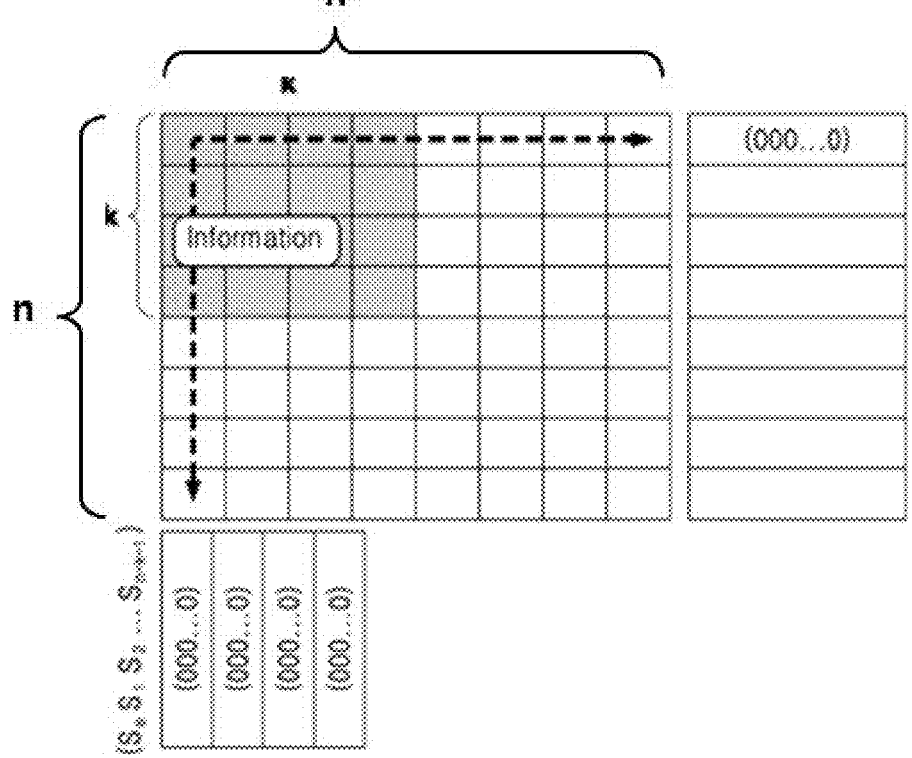
FIG. 2 is a diagram for explaining a conventional early stopping technique for decoding according to the related art.

FIG. 2 is a diagram for explaining a conventional early stopping technique for decoding according to the related art.

As illustrated in FIG. 2, syndromes are generally calculated by taking a product of $R^H$ and a parity check matrix.

Figure 3:
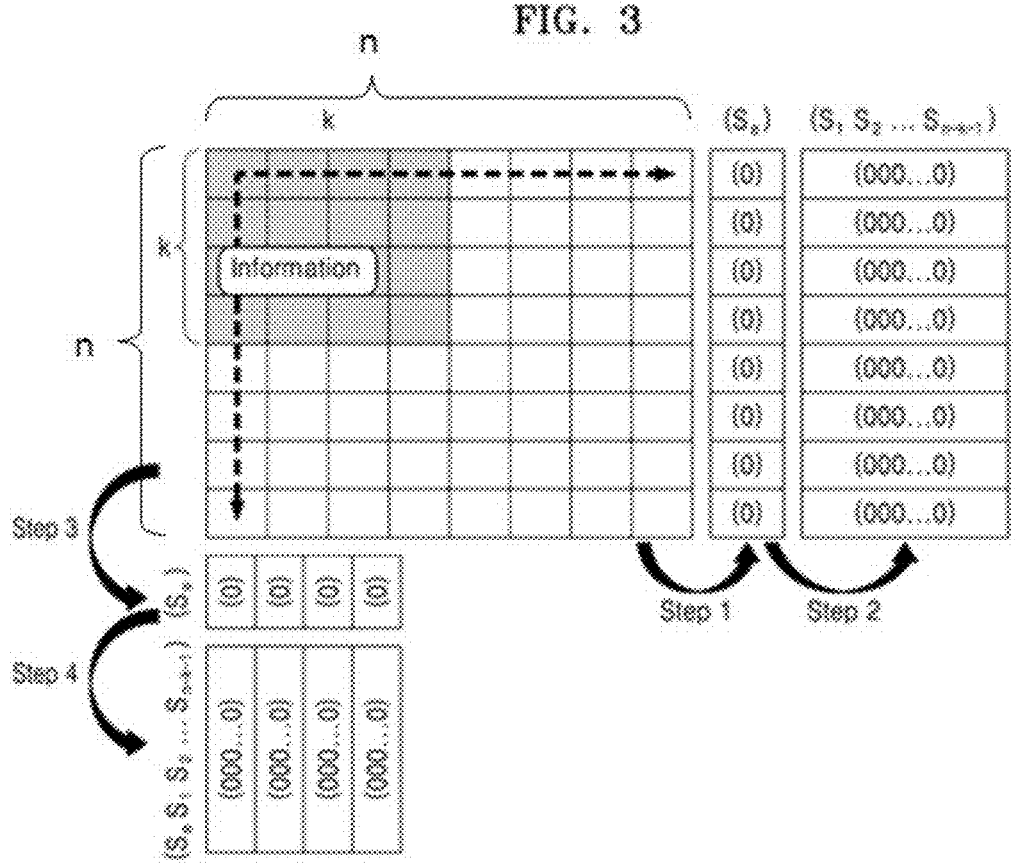
FIG. 3 is a diagram for explaining an early stopping technique for decoding according to an embodiment of the invention.

As illustrated in FIG. 3, however, an embodiment of the invention may obtain decision results of 1-bit syndromes by multiplying an n by 1 matrix having all values of 1, instead of the parity check matrix, to $R^H$ having a length of 1 by n, so as to lower complexity.

Here, if the decision result is 1, this means that a single error is included, and if the result is 0, this means that either there are no errors or there are two errors included.

Generally during an iterative decoding process, if an error is included in all n number of columns or rows, it is much likely to be determined as a single error than two errors.

According to this embodiment, an n number of 1-bit syndromes may be calculated, corresponding to the number of columns or rows of the block turbo code, and based on the calculated n number of 1-bit syndromes, it may be determined whether or not to proceed with the next decoding iteration.

An embodiment of the invention performs the syndrome decision with single bits and uses the probabilistic estimation that, if all n number of columns or rows are decided to be 0, then since there are no single errors included, there would not be two errors either in most of the cases.

Therefore, if the results of the syndrome decision for the n number of 1-bit syndromes show that not all of them are 0, then the next half iteration may be proceeded with. In other cases, to account for the possibility of there being two errors albeit with a very low probability, only when all of the 1-bit syndromes for all n number of columns (or rows) are 0, the syndromes of the remaining (n−k−1) bits may be obtained from a parity check matrix to check that the bit values of the remaining syndromes are also all 0. Here, k is the number of information bits.

If the syndrome of a column (or row) has a value other than 0, then the early stopping technique for the decoding may be halted.

However, if the n number of 1-bit syndromes are 0, then, this time, the 1-bit syndromes of the rows (or columns) containing information bits excluding parity bits may be obtained. If these values are all 0, then the syndromes of the remaining (n−k−1) bits may be obtained, and if they are all 0, the early stopping technique may be applied to stop further decoding iterations. Otherwise, the next decoding iteration may be continued.

In cases where there is even one error, the syndrome of each column or row vector may be obtained individually, and afterwards, as shown in FIG. 1, the values of R" for the column or row vectors that have been decided as having no errors may be used as codewords with suitable weight values multiplied to the values, to find the extrinsic information of the j-th bit position as in the equation shown below.

$$W_j = \gamma_1 \cdot (2r_j^H - 1), \qquad \text{[Equation 1]}$$

Here, $\gamma_1$ uses a value twice that of the $\beta$ used in [1].

Here, $W_j$ represents the extrinsic information of the j-th bit, $r_j^H$ represents the j-th bit of the hard decision vector $R^H$ of the input information, and $\gamma_1$ represents the compensation factor value.

In cases where a single error exists, if it was decided in the previous half iteration that there are no occurrences of two errors, then hard-input soft-output based decoding may be applied starting from the next half iteration, and if there is even one occurrence of two errors, then the positions of the three bits having the lowest reliability and the bits corrected by the hard-input soft-output based decoding may be identified, and a sum of the reliability values of the three bits having the lowest reliability is compared with the reliability values of the bits corrected by the hard-input soft-output based decoding so as to determine whether the hard-input soft-output based decoding or the conventional soft-input based Chase-Pyndiah decoding is to be performed.

According to this embodiment, the differentiation of which cases are to employ the hard-input soft-output based decoding and which cases are to employ the soft-input based decoding is based on the following basis.

Figure 4:
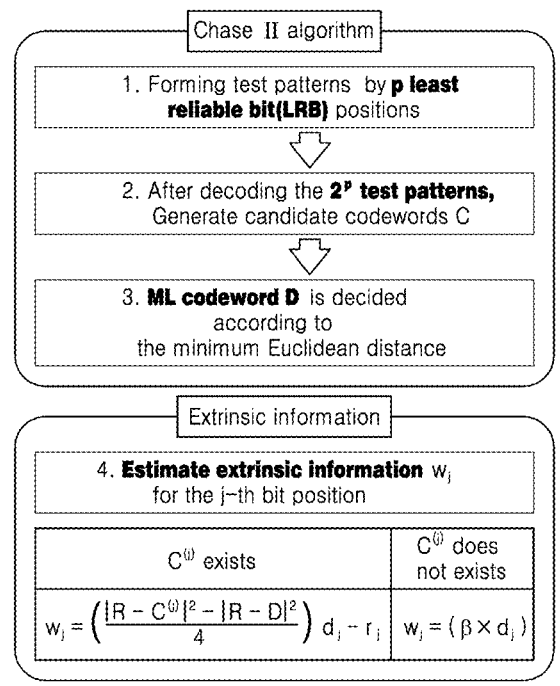
FIG. 4 illustrates the Chase-Pyndiah decoding technique, which is a soft-input based decoding technique.
Figure 5:
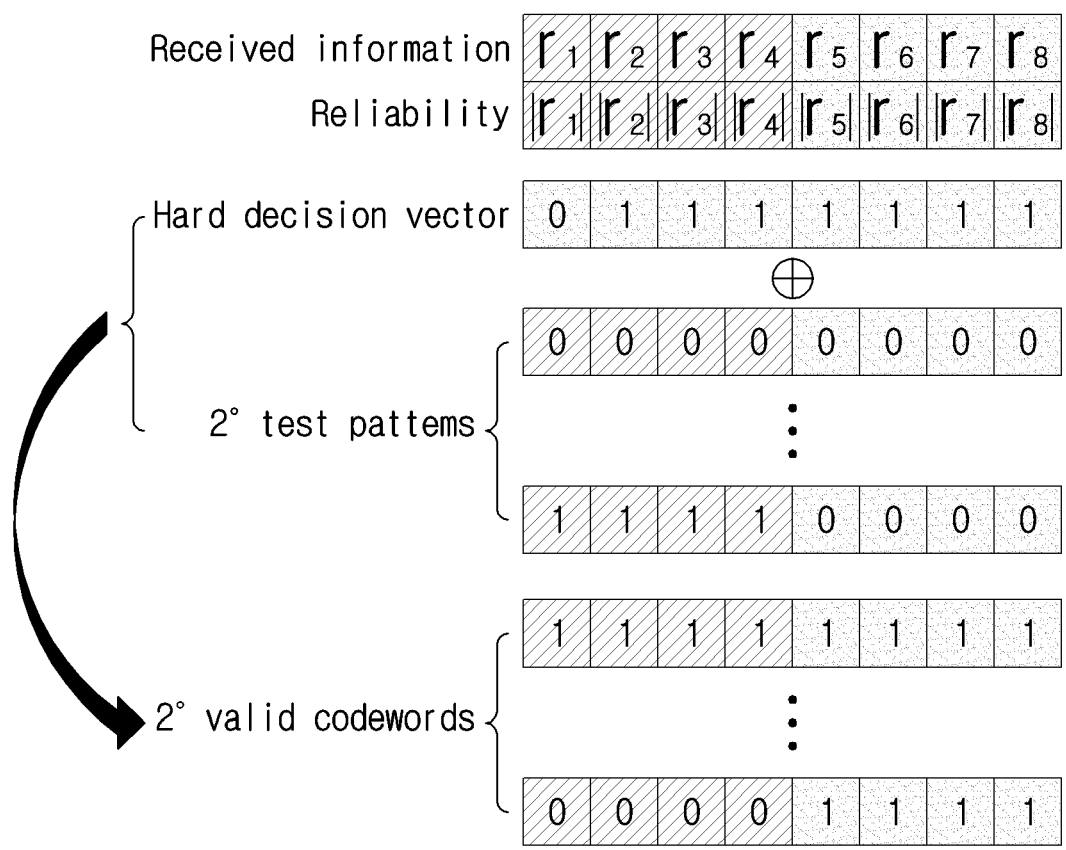
FIG. 5 illustrates a process for generating codewords in the soft-input based Chase II technique.

First, the Chase-Pyndiah decoding technique, which is an existing soft-input based decoding technique, may proceed as shown in FIG. 4. From among the group of candidate codewords generated in procedure #2, the one having the shortest Euclidean distance is determined as the codeword in procedure #3. However, as illustrated in FIG. 5, this procedure generates several codewords and then chooses the one having the closest Euclidean distance to the received information. Here, the vector having the closest Euclidean distance to the received information is the vector used for the hard decision of the received information. Therefore, when comparing the hard decision vector with one of the $2^p$ number of codewords, if there exist bit positions that show different values, the Euclidean distance to R is increased by four times the reliability values of the bits compared to the hard decision vector.

Also, if the syndrome calculation results for the input information value are decided as having single errors, decoding the hard decision vector into an extended Hamming code causes the value of 1 bit to be amplified by the Euclidean distance compared to the hard decision vector. However, in order to find the minimum Euclidean distance, it must be guaranteed that the codeword obtained in this manner through a hard-input decoding procedure has a shorter Euclidean distance than any of the remaining competing codewords.

Therefore, in an embodiment of the invention, the codeword having the shortest Euclidean distance from among the competing codewords can be set as follows.

As the competing codewords form a codeword set with the codewords obtained with hard-input soft-output based decoding, the values of at least 4 bits must be different. Therefore, the case having the shortest Euclidean distance from the input information values among the codewords that have at least 4 bits different is when the bit value corrected previously by a hard-input soft-output based decoding is the same as the hard decision bit and the values of three bits from among the remaining bits are flipped.

In this case, in order for the Euclidean distance to be minimized, the 3 bits referred to above must have the lowest reliability values. Therefore, supposing that the value with the lowest reliability is present in the positions of the three bits, the sum of the reliability values of the three bits may be compared with the reliability value of the one bit corrected with conventional hard-input soft-output based decoding, and if the reliability of the bit corrected by the hard-input soft-output based decoding is smaller, then hard-input soft-output based decoding may be applied.

Here, the extrinsic information of the j-th bit may be obtained by the equation below.

$$w_j = \gamma_2 \cdot (2d_j^{HDD} - 1), (j=1,2,\ldots n) \qquad \text{[Equation 2]}$$

Here, $w_j$ represents the extrinsic information of the j-th bit, $d_j^{HDD}$ represents the j-th bit value of the vector generated by a hard decision decoding of the input information, and $\gamma_2$ represents the correction factor value.

Here, the best performance was obtained when $\gamma_2$ is three times the value of $\beta$, and as such, this value was applied.

Otherwise, the soft-input based Chase-Pyndiah decoding technique may be applied to proceed with the decoding process.

If the results of calculating the syndromes for the input information value mean that there are two errors, then error correction would not be possible with the conventional hard-input decoding, and thus the soft-input based Chase-Pyndiah decoding technique may be applied.

However, in the case of an extended Hamming code, after first decoding the Hamming code, the decision result is given as 0 or 1 depending on whether the values of the remaining extended bits subjected to mod 2 computation with each bit value of the Hamming code is 0 or 1, so that if an error occurs in 1 bit from among the bits corresponding to the Hamming code and an error occurs in 1 bit in the parity bit added during the extending of the Hamming code, then error correction would be possible.

To take into account such cases, the present embodiment may employ hard-input soft-output based decoding of low complexity for certain error patterns, even when there is an occurrence of two errors.

To differentiate when to perform the hard-input soft-output based decoding and when to perform the soft-input based decoding, the following differentiation criteria may be used.

If it was decided that there are two errors, performing decoding using hard-input information would cause additional flips of 2 bits during the error correction procedure. The Euclidean distance between the hard decision vector and the channel information would be increased by four times the reliability values of the 2 bits where flipping occurred.

However, if a codeword obtained after hard-input information based decoding is to have the minimum Euclidean distance from among the group of candidate codewords, there should not be a codeword having a shorter Euclidean distance from among the codewords having a minimum of 4 bits different from the codeword.

If the reliability value of the bit corrected by a hard-input soft-output based decoding matches the values of the two bits having the lowest reliability, then there can be no other competing codeword that has a shorter distance. As such, when the above is satisfied, the value obtained with the hard-input decoding may be decided as the codeword, and the extrinsic information of the j-th bit may be obtained by the equation shown below.

$$w_j = \gamma_2 \cdot (2d_j^{HDD} - 1), (j=1,2,\ldots,n) \qquad \text{[Equation 3]}$$

Here, the best performance was obtained when $\gamma_2$ is three times the value of $\beta$, and as such, this value was applied.

Otherwise, soft-input based decoding may be applied to proceed with the error correction process.

Figure 6:
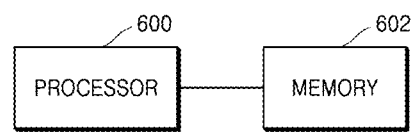
FIG. 6 illustrates the composition of a block turbo code decoding apparatus according to a preferred embodiment of the invention.

FIG. 6 illustrates the composition of a block turbo code decoding apparatus according to a preferred embodiment of the invention.

As illustrated in FIG. 6, an apparatus based on this embodiment can include a processor 600 and a memory 602.

The processor 600 can include a CPU (central processing unit) or a virtual machine, etc., that is capable of running a computer program.

The memory 602 can include a non-volatile storage device such as a fixed type hard drive or a detachable storage device. A detachable storage device can include a compact flash unit, a USB memory stick, etc. The memory 602 can also include volatile memory such as various types of random access memory.

The memory 602 may store program instructions executable by the processor 600.

For decoding a block turbo code with low complexity, the memory 602 can store program instructions that can be executed by the processor 600 to generate an input information value for a next half iteration by using channel passage information and the extrinsic information and reliability factor of a previous half iteration, generate a hard decision word by way of a hard decision of the input information value, calculate an n number of 1-bit syndromes corresponding to the number of columns or rows of the block turbo code by using the hard decision word, and determine whether or not to proceed with the next half iteration by using the calculated n number of 1-bit syndromes.

Here, the hard decision word may be a 1 by n matrix, and the 1-bit syndromes may be calculated by multiplying the hard decision word with an n by 1 matrix having all values of 1.

Also, to determine whether or not to proceed with the next half iteration, the memory 602 may store program instructions for calculating syndromes of n−k−1 bits for rows or columns of the block turbo code by multiplying the input information value with a parity check matrix if the n number of 1-bit syndromes are all 0, and determining whether or not the calculated (n−k−1)-bit syndromes are all 0, where the next half iteration can be performed if any one of the (n−k−1)-bit syndromes is not 0.

Also, the memory 602 may store program instructions for determining whether or not to apply hard-input soft-output based decoding, and, if the calculated n number of 1-bit syndromes are all 1, then determining whether or not to apply hard-input soft-output based decoding in the next half iteration according to whether or not there are two errors in the previous half iteration.

Furthermore, the program instructions may identify the positions of three bits of the lowest reliability and a bit corrected by the hard-input soft-output based decoding, if there are two errors included in the previous half iteration, and may compare the sum of the reliability values of the three bits of lowest reliability with the reliability value of the bit corrected by the hard-input soft-output based decoding to decide whether or not to perform the hard-input soft-output based decoding.

Also, the program instructions may, if the result of calculating the syndromes for the input information value includes two errors, decide whether or not to perform a hard-input soft-output based decoding by checking whether or not the reliability values of two bits having the lowest reliability and of the bits corrected by the hard-input soft-output based decoding match each other.

Figure 7:
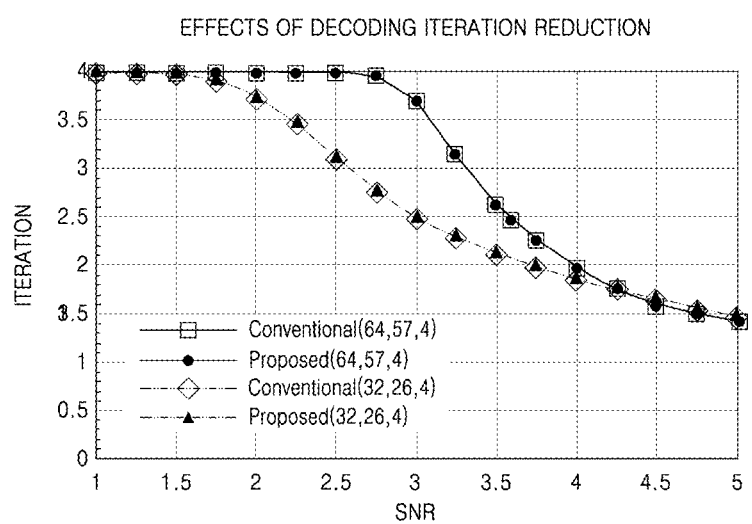
FIG. 7 illustrates the effect of complexity reduction provided by a syndrome-based process for decoding block turbo codes according to an embodiment of the invention.

FIG. 7 illustrates the effect of complexity reduction provided by a syndrome-based process for decoding block turbo codes according to an embodiment of the invention.

Here, 'Conventional' represents the technique disclosed in Prior Art 4 mentioned above.

Referring to FIG. 7, when decoding a block turbo code that has (32,26,4) and (64,47,4) extended Hamming codes as component codes, it can be seen that the effects of decoding iteration reduction for each level of SNR are the same for the case of the early stopping technique of Prior Art 4 and the case of applying a method proposed as an embodiment of the invention to the same Chase-Pyndiah decoding technique.

Figure 8:
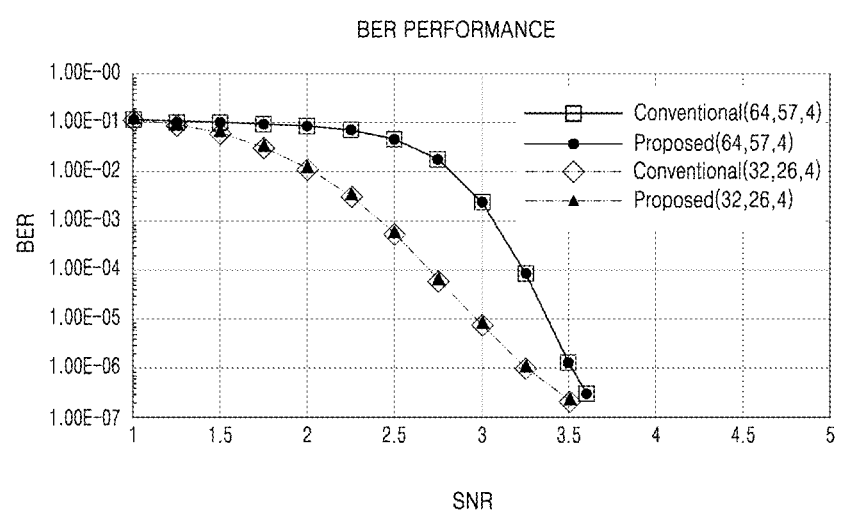
FIG. 8 illustrates the BER performance of a syndrome-based process for decoding block turbo codes according to an embodiment of the invention.

FIG. 8 illustrates the BER performance of a syndrome-based process for decoding block turbo codes according to an embodiment of the invention.

As illustrated in FIG. 8, for decoding a block turbo code that has (32,26,4) and (64,47,4) extended Hamming codes as component codes, it can be seen that, when comparing the BER performance between the case of the early stopping technique of Prior Art 4 with the case of the method proposed as an embodiment of the invention to the same Chase-Pyndiah decoding technique, the performance levels are the same for the conventional technique and the proposed technique for all cases of the (32,26,4) and the (64,47,4) extended Hamming codes used as component codes.

Figure 9:
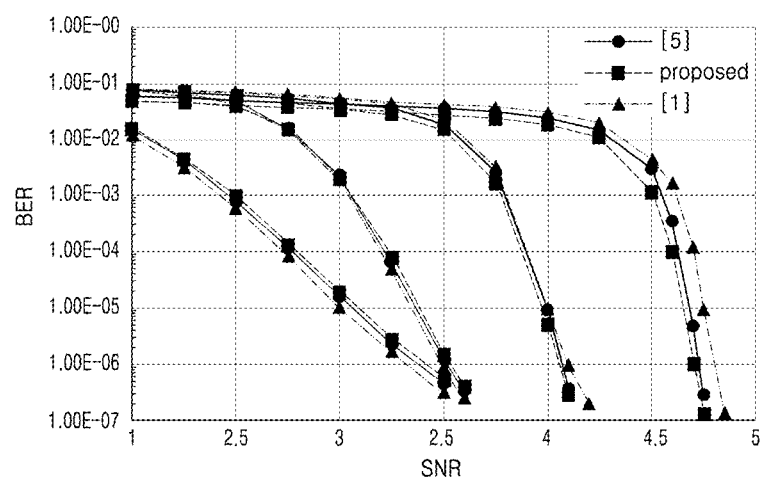
FIG. 9 illustrates the BER performance when applied to a block turbo code using (32,26,4)/(64,57,4)/(128,120,4)/(256,247,4) codes as component codes.

FIG. 9 illustrates the BER performance when applied to a block turbo code using (32,26,4)/(64,57,4)/(128,120,4)/(256,247,4) codes as component codes.

Referring to FIG. 9, it can be seen that overall the technique based on an embodiment of the invention and two existing techniques, those disclosed in Prior Art 1 and Prior Art 5, show very similar results in terms of BER performance, and that the greater the length of the component codes, the greater the improvement in performance of the technique based on an embodiment of the invention over the existing techniques.

FIG. 10A to 10D compare with Prior Art 5 the change in applied rates of the low-complexity hard-input soft-output based decoding from among cases decided to be single errors.

FIGS. 10A to 10D show, for a block turbo code using four different codes having code rates between about 0.6 and 0.9, the changes in the rate of making corrections with hard-input soft-output based decoding for an embodiment of the invention in comparison with the technique disclosed in Prior Art 5, which is a technique that corrects a large part of single errors with hard-input soft-output based decoding from among existing studies.

As can be seen from the results, the rate of increase differs according to the number of iterations, and it can be observed that on average the low-complexity decoding is used more, from a minimum of 1.4 times to 5.6 times more.

Thus, by using hard-input decoding having a low complexity instead of the existing Chase-Pyndiah decoding technique having a high complexity, the overall decoding complexity can be greatly reduced, tantamount to the amount of increase in the applied rate.

FIG. 11A to 11D illustrate the results of measuring the applied rates of the low-complexity hard-input soft-output based decoding from among cases decided as having two errors.

FIG. 11A to 11D show the results of comparing 10,000 samples. Referring to FIG. 11, by applying the proposed technique to cases having two errors, it is possible to correct some of the errors with only the technique for decoding an extended Hamming code based on hard-input information, and consequently, the complexity can be greatly improved by as much as the applied rate compared to the existing technique [Prior Art 5].

The embodiments of the invention set forth above are disclosed for illustrative purposes only. A person of ordinary skill in the art would be able to make various modifications, alterations, and additions without departing from the spirit and scope of the invention, and such modifications, alterations, and additions are to be interpreted as being encompassed within the scope of claims set forth below.

What is claimed is:

1. A syndrome-based decoding method for a block turbo code in a decoder, the block turbo code having an extended Hamming code as a component code thereof, the decoding method comprising:
 (a) receiving an input information value according to a result of $(m-1)^{th}$ half iteration decoding;
 (b) generating a hard decision word by way of a hard decision of the input information value;
 (c) calculating an n number of 1-bit syndromes by using the hard decision word, the n number of 1-bit syndromes corresponding to a number of columns or rows of the block turbo code;

(d) determining whether or not to proceed with $m^{th}$ half iteration by using the calculated n number of 1-bit syndromes; and (e) determining whether or not to apply hard-input soft-output based decoding, wherein said step (d) comprises:

calculating syndromes of n−k−1 bits for rows or columns of the block turbo code by multiplying the input information value with a parity check matrix if the n number of 1-bit syndromes are all 0; and determining whether or not the calculated (n−k−1)-bit syndromes are all 0, and wherein a next half iteration is performed if any one of the (n−k−1)-bit syndromes is not 0, wherein, if the n number of 1-bit syndromes calculated in said step (c) are all 1, then said step (e) determines whether or not to apply hard-input soft-output based decoding in the next half iteration according to whether or not there are two errors in the previous half iteration, wherein said step (e) comprises:

if there are two errors included in the previous half iteration, identifying positions of three bits of lowest reliability and a bit corrected by a hard-input soft-output based decoding, and comparing a sum of reliability values of the three bits of lowest reliability with a reliability value of the bit corrected by the hard-input soft-output based decoding to decide whether or not to perform the hard-input soft-output based decoding, wherein said step (e) comprises:

if a result of calculating the syndromes for the input information value includes two errors, deciding whether or not to perform a hard-input soft-output based decoding by checking whether or not reliability values of two bits having lowest reliability and of bits corrected by the hard-input soft-output based decoding match each other.

2. The decoding method of claim 1, wherein the hard decision word is a 1 by n matrix, and the 1-bit syndromes are calculated by multiplying the hard decision word with an n by 1 matrix having all values of 1.

3. The decoding method of claim 1, wherein said step (c) to said step (d) are performed sequentially for all of the rows or columns.

4. A syndrome-based decoding apparatus for a block turbo code, the block turbo code having an extended Hamming code as a component code thereof, the decoding apparatus comprising:

a processor; and a memory connected to the processor, wherein the memory stores program instructions executable by the processor to:

(a) receiving an input information value according to a result of $(m-1)^{th}$ half iteration decoding;

(b) generate a hard decision word by way of a hard decision of the input information value;

(c) calculate an n number of 1-bit syndromes by using the hard decision word, the n number of 1-bit syndromes corresponding to a number of columns or rows of the block turbo code;

(d) determine whether or not to proceed with $m^{th}$ half iteration by using the calculated n number of 1-bit syndromes; and (e) determining whether or not to apply hard-input soft-output based decoding, wherein said step (d) comprises:

calculating syndromes of n−k−1 bits for rows or columns of the block turbo code by multiplying the input information value with a parity check matrix if the n number of 1-bit syndromes are all 0; and determining whether or not the calculated (n−k−1)-bit syndromes are all 0, and wherein a next half iteration is performed if any one of the (n−k−1)-bit syndromes is not 0, wherein, if the n number of 1-bit syndromes calculated in said step (c) are all 1, then said step (e) determines whether or not to apply hard-input soft-output based decoding in the next half iteration according to whether or not there are two errors in the previous half iteration, wherein said step (e) comprises:

if there are two errors included in the previous half iteration, identifying positions of three bits of lowest reliability and a bit corrected by a hard-input soft-output based decoding, and comparing a sum of reliability values of the three bits of lowest reliability with a reliability value of the bit corrected by the hard-input soft-output based decoding to decide whether or not to perform the hard-input soft-output based decoding, wherein said step (e) comprises:

if a result of calculating the syndromes for the input information value includes two errors, deciding whether or not to perform a hard-input soft-output based decoding by checking whether or not reliability values of two bits having lowest reliability and of bits corrected by the hard-input soft-output based decoding match each other.

\* \* \* \* \*